United States Patent
Deng et al.

(10) Patent No.: US 7,904,635 B2
(45) Date of Patent: Mar. 8, 2011

(54) POWER CUT DATA RECOVERY AND DATA MANAGEMENT METHOD FOR FLASH MEDIA

(75) Inventors: Guoshun Deng, Guangdong (CN); Xiaohua Cheng, Guangdong (CN); Feng Xiang, Guangdong (CN)

(73) Assignee: Netac Technology Co., Ltd., Guangdong (CN)

( * ) Notice: Subject to any disclaimer, the term of this patent is extended or adjusted under 35 U.S.C. 154(b) by 59 days.

(21) Appl. No.: 10/547,758

(22) PCT Filed: Feb. 26, 2004

(86) PCT No.: PCT/CN2004/000145

§ 371 (c)(1),
(2), (4) Date: Jun. 30, 2006

(87) PCT Pub. No.: WO2004/079575

PCT Pub. Date: Sep. 16, 2004

(65) Prior Publication Data

US 2007/0021963 A1 Jan. 25, 2007

(30) Foreign Application Priority Data

Mar. 4, 2003 (CN) .............................. 03 1 04983

(51) Int. Cl.
*G06F 12/00* (2006.01)
*G06F 13/00* (2006.01)
*G06F 13/28* (2006.01)
(52) U.S. Cl. ..................... 711/103; 711/154; 711/158
(58) Field of Classification Search .............. 711/158, 711/103
See application file for complete search history.

(56) References Cited

U.S. PATENT DOCUMENTS

| 5,532,463 A | 7/1996 | Debelleix et al. |
| 5,905,993 A * | 5/1999 | Shinohara .................... 711/103 |
| 6,170,066 B1 * | 1/2001 | See ............................ 714/22 |
| 6,219,768 B1 | 4/2001 | Hirabayashi et al. |

(Continued)

FOREIGN PATENT DOCUMENTS

EP 0398545 A1 11/1990

(Continued)

OTHER PUBLICATIONS

Supplementary European Search Report for Application No. 04714710 issued Apr. 23, 2010.

*Primary Examiner* — Stephen C. Elmore
*Assistant Examiner* — Mark A Giardino, Jr.
(74) *Attorney, Agent, or Firm* — Lowe Hauptman Ham & Berner LLP

(57) ABSTRACT

The present invention provides a method of data management for a flash memory medium, characterized in that the status flag of the memory block of said flash memory medium is set as an unfinished state during operating the memory block; after finishing the manipulation, the status flag is set from the unfinished to a finished state. This method ensures that the original data in the flash memory medium will not be lost even if the false power cut occurs when writing the data into the flash memory medium. The present invention also provides a method of writing and a method of recovering the data in the flash memory medium using the above-mentioned data management method.

9 Claims, 4 Drawing Sheets

U.S. PATENT DOCUMENTS

| | | | |
|---|---|---|---|
| 6,510,083 | B1 | 1/2003 | See et al. |
| 7,039,788 | B1* | 5/2006 | Chang et al. ................ 711/203 |
| 2003/0163663 | A1* | 8/2003 | Aasheim et al. ............. 711/202 |
| 2003/0189860 | A1 | 10/2003 | Takeuchi et al. |
| 2005/0036390 | A1 | 2/2005 | Nakada et al. |

FOREIGN PATENT DOCUMENTS

| | | |
|---|---|---|
| JP | 8235028 A | 9/1996 |
| JP | 2001344149 A | 12/2001 |
| WO | 03003219 A1 | 1/2003 |
| WO | 03010671 A1 | 2/2003 |

* cited by examiner

| Block 0 | Page 0 | Data storage Area | Redundancy Area |
|---|---|---|---|
| | Page 1 | | |
| | ⋮ | | |
| | Last page | | |
| Block 1 | Page 0 | | |
| | Page 1 | | |
| | ⋮ | | |
| | Last page | | |
| ⋮ | ⋮ | ⋮ | ⋮ |
| Last block | Page 0 | | |
| | Page 1 | | |
| | ⋮ | | |
| | Last page | | |

Fig. 2

| A bit for the status flag | Reserved 3 bytes | 2 state bits | Logic address 1 | ECC2 | Logic address 2 | ECC1 |
|---|---|---|---|---|---|---|

Fig. 3

POWER CUT DATA RECOVERY AND DATA MANAGEMENT METHOD FOR FLASH MEDIA

FIELD OF THE INVENTION

The present invention relates to the field of the semiconductor storage, more particularly, to a data management method for a flash memory medium. Using this method to manage data, the original data and newly written data in the flash memory medium will not be lost even if a false power cut happens unexpectedly whenever the data is being written into said flash memory medium, hence, safety of storing data by the flash memory medium gets greatly improved.

BACKGROUND OF THE INVENTION

Mobile storage devices with flash memory mediums have been widely used and have gradually replaced the floppy disk. However, shortcomings of the flash memory medium also exist in applications. For example, when writing new data into a flash memory medium or modifying the saved data, people need firstly to "transfer" the data of a memory block specified by the respective physical address to another memory block specified by another address because of the well-known specific read-write characteristics of the flash memory medium.

The principle of data reading by the flash memory medium resembles that by a hard disk of PC, both acquire information in the disk by reading a file allocation table, directory and the like. If a false power cut occurs by accident or the misoperation of a user during the process of transferring the original data, the process will be interrupted. Thus the transfer of the original data is not finished when the false power cut occurs, and the part of the original data is not updated in the file allocation table, directory and the like. Finally, the data involved in the transfer will be unreadable and become invalid data. Therefore, files containing the part of data that have been saved become invalid and a data loss is thus caused.

Additionally, because of the specific read-write characteristics of the flash memory medium, an erasure operation for the memory block is needed, which requires all bits in the memory block are set with logic value "1". If a false power cut occurs during the erasure operation, there may be a condition that some bits in the memory block may have been set with logic value "1", while the remaining bits may still be in logic value "0", and errors will occur when new data is written into said memory block.

SUMMARY OF THE INVENTION

The present invention provides a method of data management for the flash memory medium with respect to the shortcomings of the flash memory medium in prior art, such as poor reliability, poor fault tolerance, data unsafety and poor capability of handling a false power cut. With the present method, the original data stored in the flash memory medium before the false power cut happens can be completely saved and the usability of all the blank memory blocks in the flash memory medium can be kept. Therefore, properties of the stability, the data safety and the fault tolerance of the flash medium memory are improved.

One object of the present invention is to provide a method of the data management for the flash memory medium. Said flash memory medium includes a plurality of memory blocks; each said memory block includes a plurality of pages; each said page includes a data storage area and a redundancy area, wherein said data storage area records data of a user and said redundancy area records dedicated information of the flash chip where the page is located and the index information such as the logic address of the memory block where the page is located as well as other information set by users, or the redundancy area can be left blank.

A status flag is set in the redundancy area of at least one of the plurality of pages of at least one of the plurality of the memory blocks which is set as an unfinished state during the process of writing data into said memory block and a finished state after the accomplishment of the process.

In accordance with the present invention, said unfinished state indicates that the process of storing data to said memory block is unfinished, and said finished state indicates that the process of storing data to said memory block is finished. Said process of storing data includes steps of: copying the data to be reserved from a memory block 800 specified to receive new data to a memory block 900, or writing new data into said memory block 900 or copying the data stored in said original memory block 800 to said memory block 900 and writing new data into said original memory block 800 and/or said memory block 900. In the above steps, said memory block receiving new data is a memory block found in the flash memory medium with an address corresponding to the object address specified in the instruction of writing data.

Another object of the present invention is to provide a method of writing data into flash memory medium, wherein said flash memory medium includes a plurality of memory blocks, each said memory block includes a plurality of pages, each said page includes a data storage area and a redundancy area. The following steps are involved:

Receiving an instruction of writing new data; finding out a memory block 800 corresponding to the logic address specified by said instruction; judging whether the founded memory block 800 is blank: if blank, then writing new data into the found memory block 800; if not, then searching for a new blank block 900; copying the data to be reserved in the memory block 800 to said memory block 900 and setting the status flag of the redundancy area of at least one page in said new block 900 as an unfinished state; writing new data into said new block 900; erasing the data from the original block 800; setting the status flag in said new block 900 from the unfinished state to a finished state.

In the above method of writing data, said data to be reserved is the part that will not to be replaced by the newly written data in the original data of the original block. Said data to be reserved can be either all or a part of the original data in the original block.

Another object of the present invention is to provide a method of recovering data in a flash memory medium, wherein the method of the data management as stated above is implemented in said flash memory medium. When a voltage is applied to the flash memory medium which is in use, the following steps are adopted to recover data which may be damaged by a power cut: finding out the memory block where the data to be reserved is located by checking the memory block with the status flags set as the unfinished state and recovering data.

Another object of the present invention is to provide a method of ensuring the usability of blank memory blocks in a flash memory medium. When a voltage is reapplied to the flash memory medium, a false power cut happens during the above operation process and the memory blocks with the redundancy area with logic values all of "1" and the data storage area with logic values not all as "1" are found out and erased to ensure the usability of the memory blocks with blank redundancy area.

Said logic values can be represented by numbers, characters or the combination of numbers and characters, e.g., logic value "1".

By using the method of the data management provided in the present invention, i.e., setting status flags for the memory blocks, the data to be reserved in the flash medium memory will not be lost during the process of writing new data into the flash memory medium when a false power cut happens by accident or misoperation, and the read-write error caused by the unfinished erasure of the memory blocks due to the above reason can be avoided.

BRIEF DESCRIPTION OF THE DRAWINGS

FIG. 2 illustratively shows a framework structure of the memory blocks and pages in a flash memory medium;

FIG. 3 illustratively shows the division of the redundancy area of the flash memory medium;

DETAILED DESCRIPTION OF THE PRESENTLY PREFERRED EMBODIMENTS

FIG. 2 shows a physical structure of a flash memory medium. The minimum physical storage unit of said flash memory medium is a page and a plurality of pages constitutes a memory block (Physical Block). Each chip includes a plurality of blocks, each said page includes a data storage area of a certain number of bytes and a redundancy area of a certain number of bytes, e.g., each page may include a data storage area of 512 bytes and a redundancy area of 16 bytes, or a data storage area of 2 K bytes and a redundancy area of 64 bytes.

The assignments of bytes in the redundancy area is diverse, e.g., one or more bytes can be assigned to set the status flag to indicate the status of data and/or the operation status of the memory block where the page is located. FIG. 3 is an example of the division of the redundancy area in the flash memory medium.

According to the present invention, the status flag is set in the redundancy area of said page to indicate the status of the memory block where the page is located. Said status flag includes finished state and unfinished state. Said unfinished state indicates that the process of writing data into said memory block is unfinished and said finished state indicates that the process of writing data into said memory block is finished. In addition, when all bits in the redundancy area have logic value "1", and new data can be written into the page.

As shown in FIG. 3, an embodiment of the present invention assigns the 0'th byte in the redundancy area as the flag bit for setting the status flag. However, it is understood that the present invention is not limited thereof for those skilled in the art.

Figure 1:
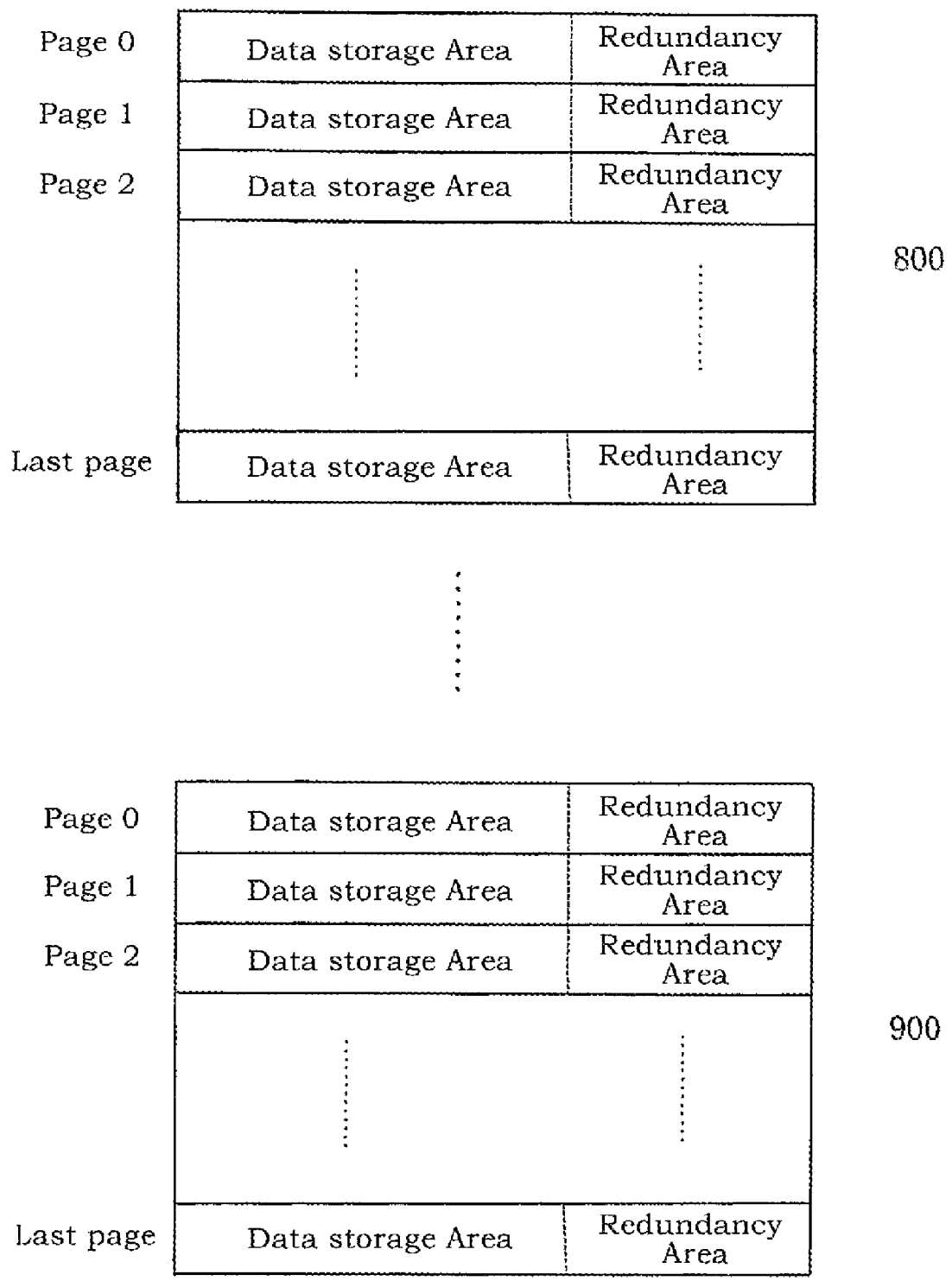
FIG. 1 is a schematic view for illustrating the original memory blocks and the memory block in the method of the data management of the present invention.
Figure 4:
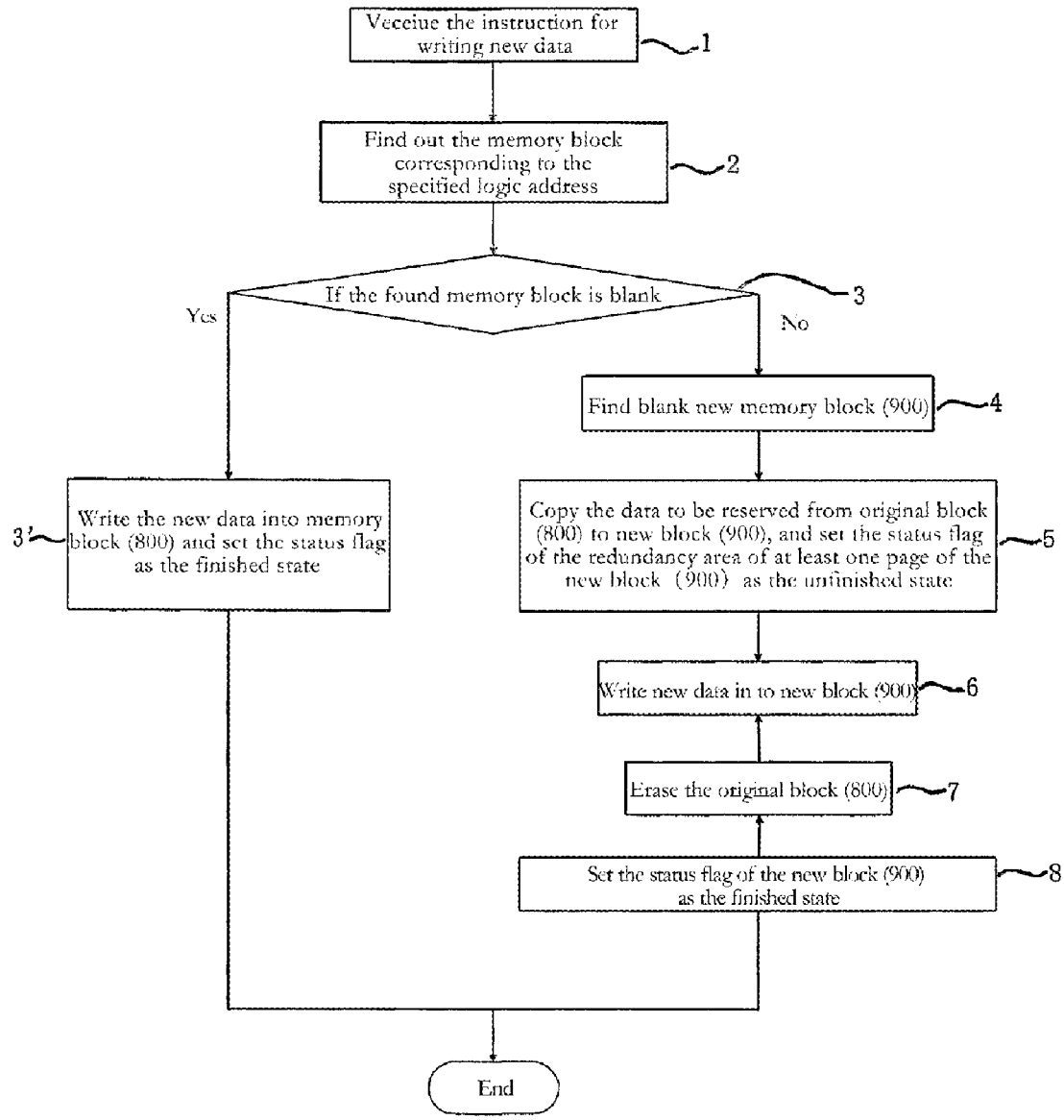
FIG. 4 is a chart flow of an embodiment of writing the new data using the method of data management in a flash memory medium of the present invention.

FIG. 1 and FIG. 4 are used to describe the method of data management for the flash memory medium, and to further explain the possibility that the safety of the data is kept when false power cut occurs during writing data into the flash memory medium. As shown in FIG. 1, when the method of data management provided in the present invention is implemented in the flash memory medium, the data operation can be performed between memory blocks 800 and 900.

As shown in FIG. 4, when the instruction of writing new data from the operating system is received by the flash memory medium, i.e., Step 1, the controller of the storage device searches for the memory block (named as original block thereinafter) into which the new data is to be written according to the logic address specified by said instruction of writing new data, i.e., Step 2.

Step 3 judges whether the found memory block 800 is blank.

If the memory block 800 is blank, then writing the new data into the memory block 800 found out, i.e., Step 3'.

If memory block 800 is not blank, then searching one blank memory block 900 (named as new block thereinafter), i.e., Step 4.

In Step 5, the controller of the storage device copies the data to be reserved from original block 800 to new block 900, i.e., to perform a transfer of the data to be reserved in the original block and at the same time the status flag of each page in the new block 900 is set as an unfinished state.

Then writing said new data into said new block 900, and at the same time the status flags of respective pages are set as the unfinished state, i.e., Step 6, and data in said original block 800 are erased, i.e., Step 7.

The status flags of all the pages in new block 900 are set from the unfinished state to a finished state, i.e., Step 8.

In another embodiment of the present invention, when the new block is found out, the new data may be written into it first and the status flag of the new block is set as unfinished, then the data to be reserved is copied from the original block to said new block and the status flag of the new block is set as the finished state.

Step 5, copying the new data to be reserved and Step 6, writing new data, can be performed corporately, in which the status flag of the new block is set as the unfinished state first and then the finished state after the operations of copying and writing in the new block are completed.

In practice, Step 6, writing new data and Step 5, copying the new data to be reserved, can be performed corporately or in an adverse order.

Said process of writing data into the memory block and said process of setting the status flag of the memory block can also be performed corporately or in an adverse order.

And Step 7, erasing the original block may be performed after Step 8, setting the status flag of the new block as finished.

It is understood from the above description on embodiments that the data management method characterizes in that during the process of operating the new block, e.g., copying the data to be reserved from the original block to the new block or writing new data into the new block, the status flag of the new block is set as unfinished, and after the operation in the new block is finished, the status flag of the new block is set from unfinished to finished.

By implementing the data management method, even if a false power cut occurs during the process of writing data into the flash memory medium, the original data in the flash memory medium is safe and will not be lost.

In other words, the data management method ensures that the data to be reserved can be recovered when a voltage is reapplied to the flash memory medium as a false power cut occurs at any steps of the operation process.

Taking the above embodiment for example as shown in FIG. 4, when the data to be reserved is copied to the new block and the status flag of the new block is set as the unfinished state, i.e., Step 5, a false power cut happens. Because the copy operation of the original data in the original block is performed, thus the original data still exits in the original block and the data destroyed by the false power cut is only those incomplete data copied to the new block. Therefore, it only needs to erase the new block and repeat the copy operation when the voltage is reapplied.

One more example, if the false power cut occurs after the data to be reserved has been copied to the new block and the status flags in the new block have been set as the unfinished state but before new data is written into the new block, i.e., between Step 5 and Step 6, the data to be reserved in the new block is complete and the original data in the original block is also saved, while new data has not been written, the power cut will only affect the status flag of the new block with the unfinished state. Therefore, it only needs to write the new data into the new block and then set the status flags in the new block as the finished state when the voltage is reapplied. Even if the interruption occurs during the process of writing new data into the new block (the process of Step 6) and only part of the data have been written into the new block, it only needs to continue to write the remaining new data into the new block when the voltage is reapplied.

If the interruption happens after all the new data to be written have been written into the new block and before the data are erased from the original block (i.e., between Step 6 and Step 7), and the original data still exists in the original block and the data to be reserved and the new data have been saved in the new block, it only needs to set the status flags in the new block as the finished state and erase the original block when the voltage is reapplied.

If the interruption happens during the process of setting the status flags as the finished state and causes a failure of modifying the status flags, it only needs to set the status flags as the finished state again when the voltage is reapplied.

If the interruption happens before a new block is found out, there will be no loss of data in that no read-write of data has been performed. Even if the interruption occurs during erasing the original data from the original block, the only negative result will be that erasing the original data from the original block is not completed and there will be no need to perform data recovery when the voltage is reapplied.

The above description intends to explain the possibility of data recovery with the data management method when the flash memory medium suffers a false power cut.

Figure 5:
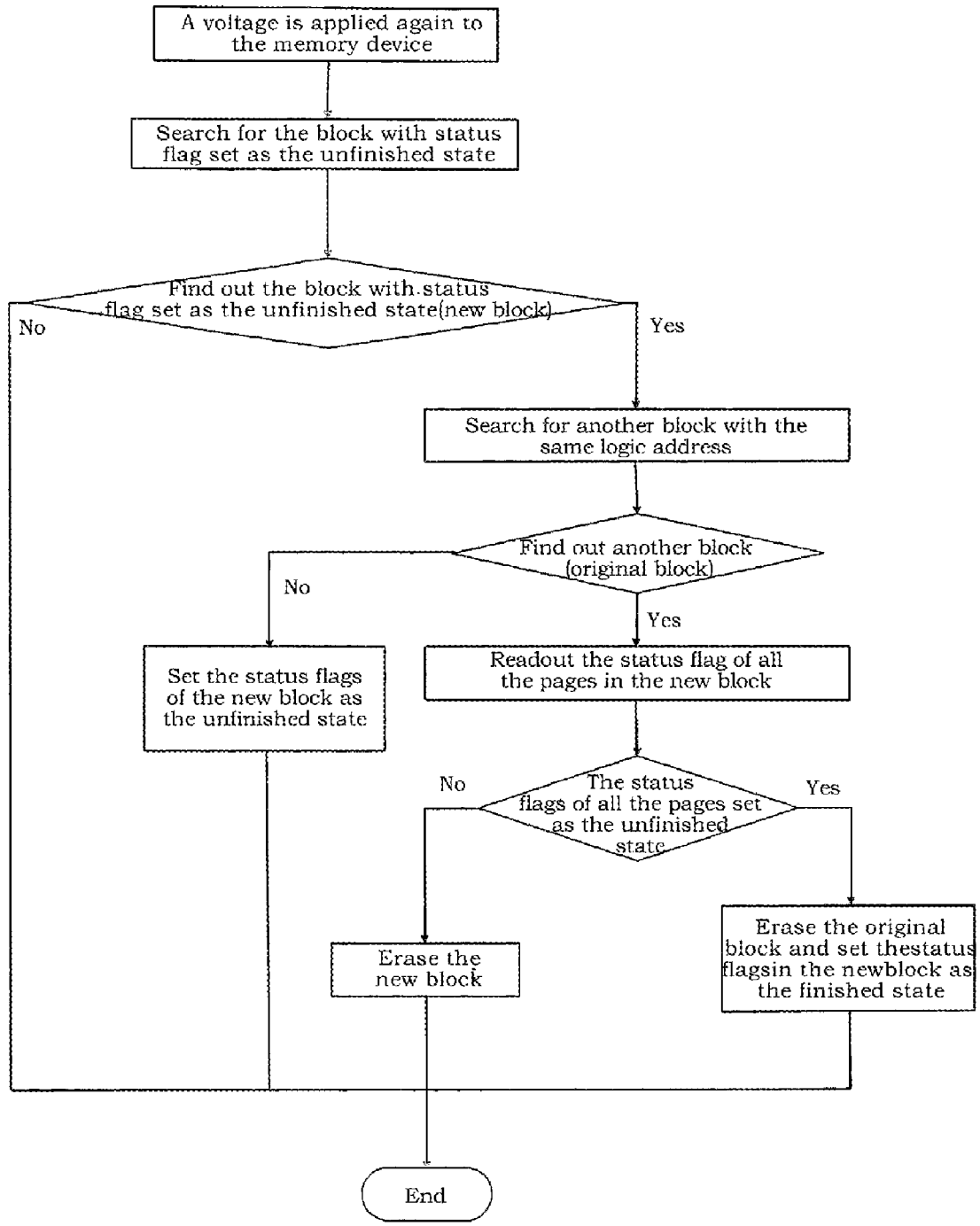
FIG. 5 is a chart flow of an embodiment of recovering data after a voltage is applied to the flash memory medium.

Below will describe incorporated with FIG. 4 and FIG. 5 the data recovery of the flash memory medium by implementing said data management method when the operation is interrupted by a false power cut and the voltage is reapplied. Said controller of the storage device searches for a memory block (said new block) with status flag set as the unfinished state. It can be known from the data management method that if the status flags in the memory block are set as the unfinished state, it means that the memory block has been used in the data writing step before the interruption and may contain invalid data which needs recovery. Thus, the controller searches for a memory block with the same logic address as the new block and this memory block is the original memory block recording the original data in the writing process before the power cut happens.

If the original block is found out, it means that the interruption happens before the step (Step 7) of erasing the original block. Then it needs to judge whether all the status flags of the redundancy areas of all the pages in said unfinished block are unfinished: if yes, it means that all data to be reserved have been transferred and the new data to be written have been stored, and then the original block is erased and the status flags of the new block are set as the finished state; if not, the new block is erased and the status flags of the original block are set as the finished state and the check list is modified.

If the original block cannot be found out, it indicates that the interruption happens during the process of erasing the original block (Step 7) or after process of erasing the original block. Then the status flags of pages of the new block are set as the finished state and the check list is modified as stated above.

Said check list is a mapping table between the physical address and the logic address of the flash memory medium and said modified check list is to change the logic address corresponding to the new block in the check list to the logic address in the instruction.

It can be understood from the descriptions of the above embodiments of the present invention that the characteristics of the data recovering lie in that the status of the memory block can be determined when the interruption happens and the data to be reserved can be found out and the data recovery then can be performed, based on checks of the status flags of the redundancy area of each page in the memory blocks of the flash memory medium. Therefore, it is still within the spirit of the present invention of modifying the method of data recovery in accordance with changes of the steps of data writing.

After recovering the original data that may be lost due to the interruption, operations of checking and eliminating errors for said blank memory block have to be performed in order to ensure that the memory blocks in the flash memory medium with all bits in the redundancy area set with logic value "1" are completely blank and delete the remaining data due to the interruption occurring in the process of erasure to avoid errors possibly occurring in the next read-write operation.

In accordance with the present invention, following methods can be adopted to check the blank memory block and eliminate errors:

First of all, finding out the memory blocks with all bits in the redundancy area set with logic value "1" on page 0, then making a judgement if all the bits of all the pages in said memory blocks are set with logic value "1", if not, then performing the erasure operation in said memory blocks.

In accordance with the present invention, after the process of the data recovery, it is preferred to perform said error checking and eliminating in all the blank memory blocks in order to empty the memory blocks that are not fully erased and ensure that all the memory blocks with blank redundancy area can be used.

Another embodiment of the present invention shows that the flash memory medium is divided into several zones and each zone includes several memory blocks according to the Solid State Floppy Disk Card protocol and has at least one blank memory block used for copying the data to be reserved to said memory block.

In the present embodiment, the data management method similar to that implemented in the preceding embodiments is adopted to manage data in each zone but the searching area in a new block is limited within the zone where the original block is located and the searching area for memory blocks (new blocks) with status flags set as unfinished is also limited within the same zone in the process of data recovery, thereby improving speeds of both writing data into the flash memory medium and the data recovery. Moreover, since the read-write operation of the data is performed between two blocks in the same zone, there will be no error occurring in other zones in the flash memory medium during said process of writing data. Therefore, it only needs to search for the blank memory blocks in the same zone and eliminate the errors.

The illustrative description of the present invention has been shown as above, It can be understood by those skilled in the art that the scheme for setting the status flags of the redundancy area is not exclusive and various kinds of known technologies may be implemented for searching new blocks. The spirit of the present invention lies in adding the setting of status flags when writing data so as to indicate the status of the related memory block and therefore effectively recovering data in case a false power cut occurs unexpectedly, that the integrity of data is kept. Therefore, various kinds of modifications are without departing from the spirit of the present invention and fall into the preserved scope limited by the claims appended below.

What is claimed is:

1. A method of data management for a flash memory medium, wherein the flash memory medium includes a plurality of memory blocks, each memory block including a plurality of pages, each page including a data storage area and a redundancy area, the data management method comprising the steps of:

setting a status flag in the redundancy area of at least one of said plurality of pages in at least one of the plurality of memory blocks to indicate an unfinished state when operating on the at least one memory block, the operating comprising:
  writing new data to a specified block of the at least one memory block specified to receive the new data if the specified block is blank, or
  copying data to be reserved from a specified block specified to receive new data to a new blank block if the specified block is not blank, writing new data to the new block, and erasing the specified block; and
setting the status flag to indicate a finished state after the operating;
wherein each status flag has only two states, an unfinished state and a finished state, the status flag is used to determine whether a failure has occurred during the writing of data, the erasing operation, or the setting of the status flags;
wherein using the status flag to recover data comprises:
  finding a first block comprising a status flag of unfinished state when power is reapplied after a power loss;
  determining whether a second block, having the same logic address as the first block, exists;
  if the second block does not exist, determining that an error has occurred during the setting of the status flag, and recovering the data by setting all the status flags as finished state and modifying a check list; and
  if the second block exists, determining whether all the status flags in the first block are set as unfinished state,
  if all the status flags in the first block are set as unfinished state, determining that a failure has occurred during the erasing operation, and recovering the data by erasing the second block and setting all the status flags in the first block as finished state, and
  if all the status flags in the first block are set as finished state, determining that a failure has occurred during the writing of data, and recovering the data by erasing the first block, setting all the status flags in the second block as finished state, and modifying the check list.

2. A method of data management in accordance with claim 1, wherein the unfinished state indicates the operating is unfinished and the finished state indicates the operating is finished.

3. A method of data management in accordance with claim 1, wherein the status flag is one or more bytes in the redundancy area in the memory block, or one or more bits in the redundancy area.

4. A method of data management in accordance with claim 1, wherein the using the status flag to determine whether a false power cut has occurred so as to recover the data further comprises:
  searching a block, in which all bits in the redundancy area of page 0 are set with logic value "1";
  determining in the block whether all bits of all the pages are set with logic value "1", and erasing the block if not.

5. A method of writing data into a flash memory medium, wherein the flash memory medium includes a plurality of memory blocks, each memory block includes a plurality of pages, each page includes a data storage area and a redundancy area, the method comprising the steps of:
  1) receiving an instruction to write new data;
  2) determining an original memory block corresponding to a logic address specified by the instruction in the flash memory medium;
  3) determining whether the original memory block is blank;
  4) if the original memory block is blank, writing new data into the original memory block; otherwise if the original memory block is not blank, searching for a new blank block;
  5) copying data to be reserved from the original memory block to the new blank memory block and setting a status flag of at least one page in the new blank memory block to an unfinished state, wherein each status flag has only two states, an unfinished state and a finished state;
  6) writing new data into the new blank memory block;
  7) erasing the data from the original memory block;
  8) setting the status flag in the new blank memory block from the unfinished state to a finished state,
wherein the status flag is used to determine whether a failure has occurred during the copying of data, writing of new data, erasing the data, or the setting of the status flags so as to recover data due to the failure, wherein using the status flag to determine whether a failure has occurred so as to recover the data comprises:
  finding a first block comprising a status flag of unfinished state when power is reapplied;
  determining whether a second block, having the same logic address as the first block, exists;
  if the second block does not exist, determining that a failure has occurred during the setting of the status flags, and recovering the data by setting all the status flags as finished state and modifying a check list; and
  if the second block exists, determining whether all the status flags in the first block are setting as unfinished state,
    if all the status flags in the first block are setting as unfinished state, determining that a failure has occurred during the erasing operation, and recovering the data by erasing the second block and setting all the status flags in the first block as finished state, and
    if all the status flags in the first block are set as finished state, determining that a failure has occurred during the writing of data, and recovering the data by erasing the first block, setting all the status flags in the second block as finished state, and modifying the check list.

6. A method in accordance with claim 5, wherein writing new data into the new blank memory block includes setting the status flag to indicate the unfinished state.

7. A method in accordance with claim 5, further comprising writing new data into the new blank memory block either after or during the execution of step 5.

8. A method in accordance with claim 5, wherein erasing the data from the original memory block is carried out after step 8.

9. A method in accordance with claim 5, wherein determining whether the original memory block is blank includes determining whether all bits in the redundancy areas of all the pages in the original memory block have logic value "1".

* * * * *